US012588533B2

(12) United States Patent
Lianto et al.

(10) Patent No.: US 12,588,533 B2
(45) Date of Patent: Mar. 24, 2026

(54) GRAIN STRUCTURE ENGINEERING FOR METAL GAPFILL MATERIALS

(71) Applicant: Applied Materials, Inc., Santa Clara, CA (US)

(72) Inventors: Prayudi Lianto, Singapore (SG); Marvin Louis Bernt, Whitefish, MT (US); Tapash Chakraborty, Dombivali (IN); Yin Wei Lim, Singapore (SG); Jing Xu, Kalispell, MT (US)

(73) Assignee: Applied Materials Inc., Santa Clara, CA (US)

( * ) Notice: Subject to any disclaimer, the term of this patent is extended or adjusted under 35 U.S.C. 154(b) by 451 days.

(21) Appl. No.: 18/225,286

(22) Filed: Jul. 24, 2023

(65) Prior Publication Data

US 2025/0038137 A1 Jan. 30, 2025

(51) Int. Cl.
*H01L 23/00* (2006.01)

(52) U.S. Cl.
CPC ............. *H01L 24/03* (2013.01); *H01L 24/05* (2013.01); *H01L 24/80* (2013.01); *H01L 24/08* (2013.01); *H01L 2224/03462* (2013.01); *H01L 2224/03466* (2013.01); *H01L 2224/03614* (2013.01); *H01L 2224/03622* (2013.01); *H01L 2224/03845* (2013.01); *H01L 2224/05011* (2013.01); *H01L 2224/05018* (2013.01); *H01L 2224/05026* (2013.01); *H01L 2224/05082* (2013.01); *H01L 2224/05147* (2013.01);
(Continued)

(58) Field of Classification Search
CPC ......... H01L 24/03; H01L 24/05; H01L 24/80; H01L 2224/03462
See application file for complete search history.

(56) References Cited

U.S. PATENT DOCUMENTS 7,208,415 B2 4/2007 Lai et al.
8,288,276 B2 * 10/2012 Yang ................. H01L 21/76849
438/643

(Continued)

OTHER PUBLICATIONS

Liu, C.-M et al. Low-temperature direct copper-to-copper bonding enabled by creep on (111) surfaces of nanotwinned Cu. Sci. Rep. 5, 9734 (2015).

(Continued)

*Primary Examiner* — Dale E Page
*Assistant Examiner* — Wilner Jean Baptiste
(74) *Attorney, Agent, or Firm* — Moser Taboada

(57) ABSTRACT

A method for depositing copper onto a substrate includes grain engineering to control the internal structure of the copper. In some embodiments, the method comprises depositing a grain control layer conformally onto a copper seed layer in a structure on the substrate where the grain control layer is a non-conducting material, etching the grain control layer using a direct deep reactive ion etch (DRIE) process to remove portions of the grain control layer on horizontal surfaces within the structure, and depositing a copper material onto the structure such that at least one grain parameter of the copper material is controlled, at least in part, by a remaining portion of the grain control layer on vertical surfaces of the structure. In some embodiments, the deposited copper material in the structure has a <111> grain orientation normal to a horizontal surface of the structure.

20 Claims, 5 Drawing Sheets

(52) U.S. Cl.

CPC ............... *H01L 2224/05166* (2013.01); *H01L
2224/05181* (2013.01); *H01L 2224/05186*
(2013.01); *H01L 2224/0519* (2013.01); *H01L
2224/05546* (2013.01); *H01L 2224/05571*
(2013.01); *H01L 2224/05647* (2013.01); *H01L
2224/0812* (2013.01); *H01L 2224/80357*
(2013.01); *H01L 2224/80896* (2013.01); *H01L
2924/04953* (2013.01); *H01L 2924/0504*
(2013.01); *H01L 2924/05442* (2013.01); *H01L
2924/059* (2013.01); *H01L 2924/062*
(2013.01); *H01L 2924/07025* (2013.01); *H01L
2924/20106* (2013.01); *H01L 2924/20107*
(2013.01)

(56)　　　　　　　References Cited

U.S. PATENT DOCUMENTS

| | | | |
|---|---|---|---|
| 11,634,830 | B2 | 4/2023 | Xu et al. |
| 2014/0103501 | A1 | 4/2014 | Chen et al. |
| 2019/0393156 | A1 | 12/2019 | Zierath et al. |
| 2020/0135690 | A1 | 4/2020 | Lianto et al. |
| 2022/0246497 | A1 | 8/2022 | Fountain et al. |
| 2023/0212773 | A1 | 7/2023 | Oberst et al. |

OTHER PUBLICATIONS

K-N. Chen, Chapter 5: Cu—Cu Direct Bonding, Encyclopedia of Packaging Materials, Processes, and Mechanics, pp. 65-80 (2019).
International Search Report for POT/US2024/039000, dated Oct. 28, 2024.

* cited by examiner

100

DEPOSIT METAL SEED LAYER ONTO SUBSTRATE — 102

DEPOSIT GRAIN CONTROL LAYER ONTO SUBSTRATE — 104

DEPOSIT POLYMER IN-SITU ONTO SUBSTRATE TO PROTECT EXPOSED CORNERS — 106

ETCH SUBSTRATE TO REMOVE PORTIONS OF GRAIN CONTROL LAYER ON HORIZONTAL SURFACES — 108

DEPOSIT METAL MATERIAL ONTO SUBSTRATE — 110

200

204

202

GRAIN STRUCTURE ENGINEERING FOR METAL GAPFILL MATERIALS

FIELD

Embodiments of the present principles generally relate to semiconductor processing of semiconductor substrates.

BACKGROUND

Hybrid bonding processes are used to join substrates and chips that have both dielectric and copper bonding surfaces. In traditional processes, the copper bonding surfaces require bonding temperatures of 300 degrees Celsius to 400 degrees Celsius to form the copper-to-copper bonds. Some devices do not have thermal budgets that can accept such a high temperature process, restricting the devices from being used in hybrid bonding processes.

Accordingly, the inventors have provided methods and structures for improving thermal requirements for hybrid bonding.

SUMMARY

Methods and apparatus for controlling metal grain parameters of gapfill materials are provided herein.

In some embodiments, a method for controlling gapfill material deposition processes may comprise depositing a metal seed layer conformally onto a substrate with at least one structure formed into the substrate, depositing a grain control layer conformally onto the substrate and into the at least one structure where the grain control layer is a non-conducting material, depositing a polymer layer on the substrate in an etch chamber such that at least one exposed corner of the at least one structure is covered during a subsequent etching process, etching the grain control layer using an etch process to remove portions of the grain control layer on horizontal surfaces within the at least one structure, and depositing a metal gapfill material onto the at least one structure such that at least one grain parameter of the metal gapfill material is controlled, at least in part, by a remaining portion of the grain control layer on vertical surfaces of the at least one structure.

In some embodiments, the method may further include at least one structure being a trench, a via, or a damascene structure, a grain control layer that is an inorganic dielectric material, an inorganic dielectric material that is SiN, SiO$_2$, or SiCN, a grain control layer that is an organic dielectric material, an organic dielectric material that is a fluoropolymer material, a polyimide material, a polybenzoxazole material, or a self-assembled monolayer, depositing the metal gapfill material onto the at least one structure forms a copper gapfill material in the at least one structure with a <111> grain orientation normal to a horizontal surface of the at least one structure, depositing the metal gapfill material onto the at least one structure forms a copper gapfill material in the at least one structure with a copper grain orientated lengthwise along a length of the at least one structure and where the copper grain fills a width of the at least one structure, at least one structure on the substrate that has sidewalls of 90 degrees or less relative to horizontal surfaces within the at least one structure, a grain control layer that is selected based on adhesion characteristics to the metal seed layer, a grain control layer that has a thickness of approximately 1 nanometer or less, at least one structure that is a trench or via formed by a lithography process in a photo-imageable organic dielectric material of the substrate, the method being used in a copper-to-copper hybrid bonding process with a bonding temperature of 250 degrees or less, a grain control layer that remains as part of the at least one structure during subsequent processing of the at least one structure, a metal gapfill material that is deposited using electrochemical plating, and/or an etch process that is a direct deep reactive ion etch (DRIE) process.

In some embodiments, a method for depositing copper may comprise depositing a grain control layer conformally onto a copper seed layer in at least one structure on a substrate where the grain control layer is a non-conducting material, depositing a polymer layer on the substrate in an etch chamber such that at least one exposed corner of the at least one structure is covered during a subsequent etching process, etching the grain control layer using a direct deep reactive ion etch (DRIE) process to remove portions of the grain control layer on horizontal surfaces within the at least one structure, and depositing a copper gapfill material onto the at least one structure such that at least one grain parameter of the copper gapfill material is controlled, at least in part, by a remaining portion of the grain control layer on vertical surfaces of the at least one structure where deposited copper gapfill material in the at least one structure has a <111> grain orientation normal to a horizontal surface of the at least one structure.

In some embodiments, the method may further include a grain control layer that is an organic dielectric material, and/or a grain control layer that has a thickness of approximately 1 nanometer or less.

In some embodiments, a non-transitory, computer readable medium having instructions stored thereon that, when executed, cause a method for depositing copper to be performed, the method may comprise depositing a grain control layer conformally onto a copper seed layer in at least one structure on a substrate where the grain control layer is a non-conducting material, depositing a polymer layer on the substrate in an etch chamber such that at least one exposed corner of the at least one structure is covered during a subsequent etching process, etching the grain control layer using a direct deep reactive ion etch (DRIE) process to remove portions of the grain control layer on horizontal surfaces within the at least one structure, and depositing a copper material onto the at least one structure such that at least one grain parameter of the copper material is controlled, at least in part, by a remaining portion of the grain control layer on vertical surfaces of the at least one structure where deposited copper material in the at least one structure has a <111> grain orientation normal to a horizontal surface of the at least one structure.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
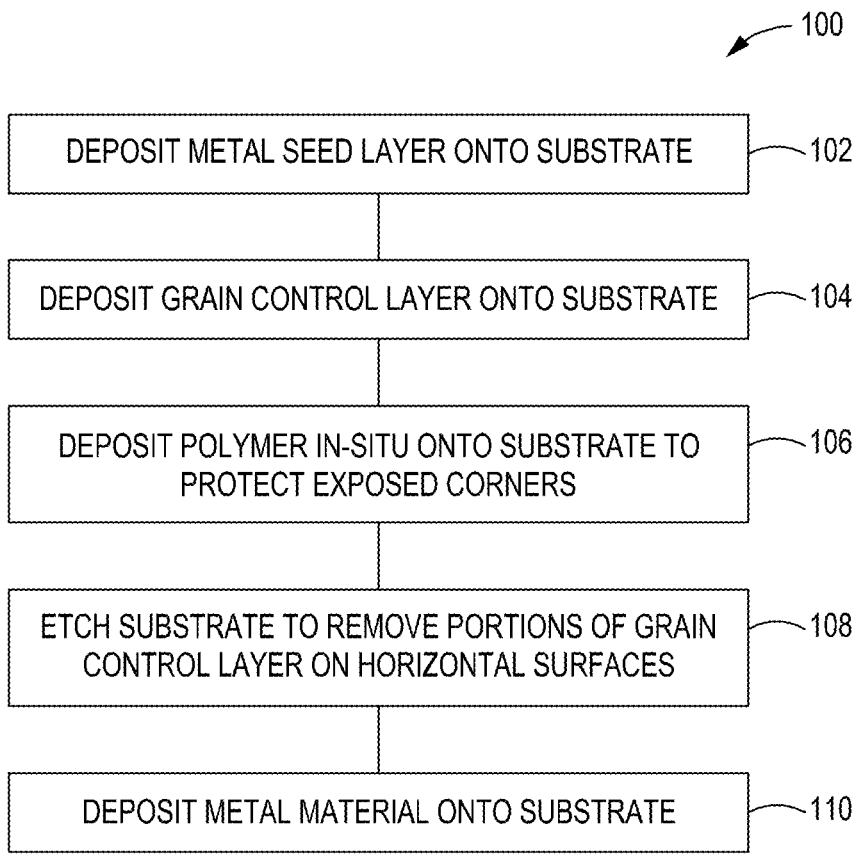
FIG. 1 is a method of controlling grain parameters of a metal gapfill material on a substrate in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and architecture provide improved hybrid bonding through grain structure engineering of metal gapfill materials deposited on a substrate. Non-conducting layers are formed on vertical surfaces of structures on the substrate to control the grain orientation and other grain parameters to enable low temperature bonding of the metal gapfill materials of the structure. In some embodiments, the bonding temperatures may be less than approximately 250 degrees Celsius, preserving the thermal budgets of temperature sensitive structures formed on the substrate. The techniques enable the full benefit of metal microstructures even on topography, such as, for example, damascene structures and the like on the substrate. In addition, fine-pitch bonding is enabled because the thickness of the grain control layer can be tuned to be as thin as possible, making the techniques scalable for high density wafer-level packaging.

Current approaches for hybrid bonding have the disadvantage of requiring a high temperature anneal of 300 degrees Celsius to 400 degrees Celsius to promote copper (Cu) diffusion and grain growth to achieve sufficient bonding strength. The high temperatures, however, can be detrimental to device performance for devices which have low thermal budgets such as, for example, memory retention thresholds that are usually less than 250 degrees Celsius or less. The inventors have observed that nanotwin copper (<111> grain-oriented copper) exhibits complete bonding at a temperature as low as 200 degrees Celsius or lower.

However, the nanotwin copper microstructure is not retained for damascene structures on a substrate which impedes the thermal advantages of using nanotwin copper for fine-pitch hybrid bonding. The inventors have found that the nanotwin copper grows perpendicular to the vertical surfaces of the structure which interferes with the nanotwin copper growing from the horizontal surfaces of the structure, creating a significant amount of grain orientation disruption which increases the required bonding temperature.

By leveraging a grain control layer on the vertical surfaces of the structure on the substrate, grain growth can be controlled to, for example, improve bonding strength at lower temperatures and the like. The grain control layer is used to inhibit the growth of metallic grains on the vertical surfaces of a structure to force the grains to form, for example, in a desired grain orientation, grain size, and/or grain position and the like. The grain control layer uses a non-conducting material to prevent grain growth of metallic materials on vertical surfaces of structures during electrochemical plating and similar processes. In some embodiments, the grain control layer may be a refractory metal oxide material and the like. In some embodiments, the grain control layer may be an inorganic dielectric material such as, but not limited to, silicon nitride (SiN), silicon dioxide (SiO$_2$), and/or silicon carbon nitride (SiCN), and the like. In some embodiments, the grain control layer may be an organic dielectric material such as, but not limited to, fluoropolymer, polyimide, polybenzoxazole (PBO), and/or self-assembled monolayer (SAM), and the like. The SAMs are formed by 2H-Perfluorooctyltrichlorosilane, 1H, 1H, 2H, 2H Perfluorodecanethiol, and/or 1H, 1H, 2H, 2H-Perfluorooctanephosphonic acid, and the like such as, but not limited to, octadecltrichlorosilane, octadecylthiol, and/or octadecylphosphophonic acid (the carbon backbone can be C6-C18). The SAMs form a hydrophobic surface due to the hydrocarbon or fluorohydrocarbon tail. The head groups are used to bind to the exposed surface, and the tails remain free—although there is intermolecular attraction in the assembled layer. In some embodiments, the thickness of the grain control layer may range from sub-nanometer to several micrometers depending on the scale and/or densities of the structures on a substrate. In some embodiments, the grain control layer may be deposited on the substrate using a chemical vapor deposition (CVD) process, a physical vapor deposition (PVD) process, an atomic level deposition (ALD) process, an aerosol-assisted (AA) CVD process, and/or a spin coating process, and the like. In some embodiments, the SAMs may be grown by immersion in a diluted solution of the chemical or by using a vapor deposition process. The deposition can occur at ambient temperatures or higher.

Figure 2:
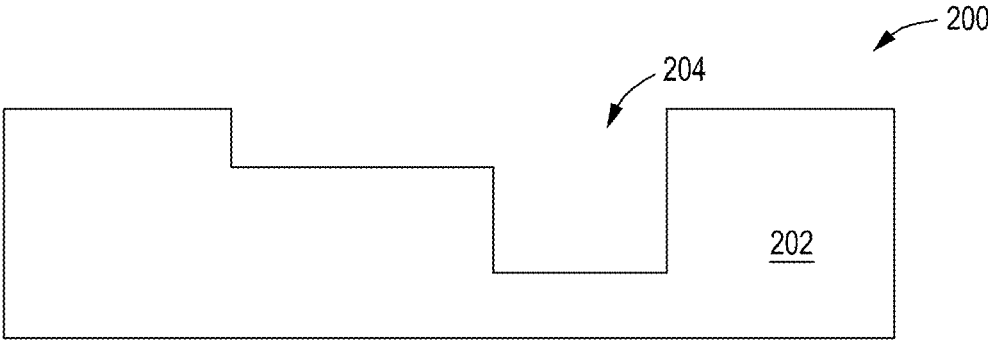
FIG. 2 depicts a cross-sectional view of a substrate with a structure in accordance with some embodiments of the present principles.
Figure 3:
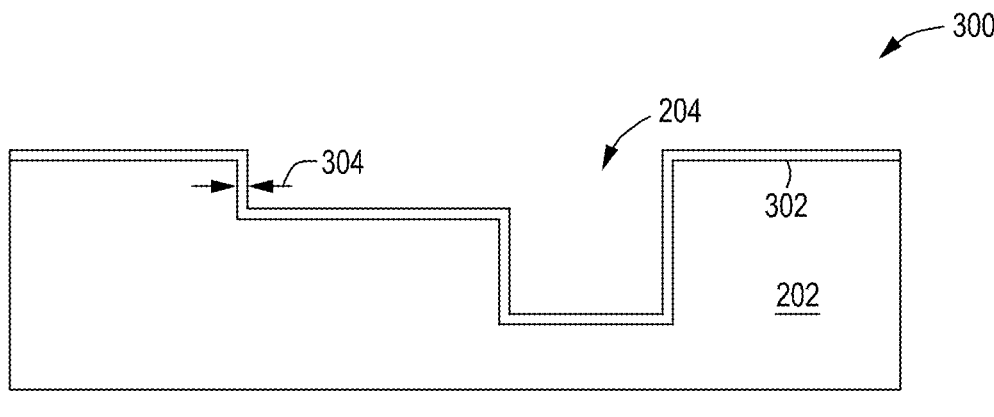
FIG. 3 depicts a cross-sectional view of a substrate with a metal seed layer in accordance with some embodiments of the present principles.

FIG. 1 is a method 100 of controlling grain parameters of metal gapfill material on a substrate. For the sake of brevity, a metal material of copper is used as an example but is not meant to be limiting. Other metal gapfill materials may benefit from the methods and architectures of the present principles. FIGS. 2-5 may be referenced during the discussion of the method 100. As depicted in a view 200 of FIG. 2, a substrate 202 has a structure 204 formed on the substrate 202. The substrate 202 material is typically formed of a dielectric material such as, but not limited to, silicon and the like. In some embodiments, the structures may be constructed in a polymer dielectric substrate material that is photo-imageable (i.e., no reactive ion etching is required to form the structure). In some embodiments, the structures may be a via, a trench, and/or, as depicted in FIG. 2, a dual damascene-type structure. The critical dimension (CD) of the structure 204 may range from approximately 100 nm to approximately 10 um. In block 102, a metal seed layer 302 is conformally deposited onto the substrate 202 and the structure 204 as depicted in a view 300 of FIG. 3. The metal seed layer 302 may have a thickness 304 of approximately 50 nm or less. In some embodiments, the metal seed layer 302 may be a copper seed layer to promote copper growth during electrochemical plating (ECP) processes. In some embodiments, the metal seed layer 302 may include a metal layer (e.g., a copper layer) formed on a barrier layer of a material such as Ti, Ta, or TaN/Ta, and the like which may have a thickness comparable to the metal seed layer 302.

Figure 4:
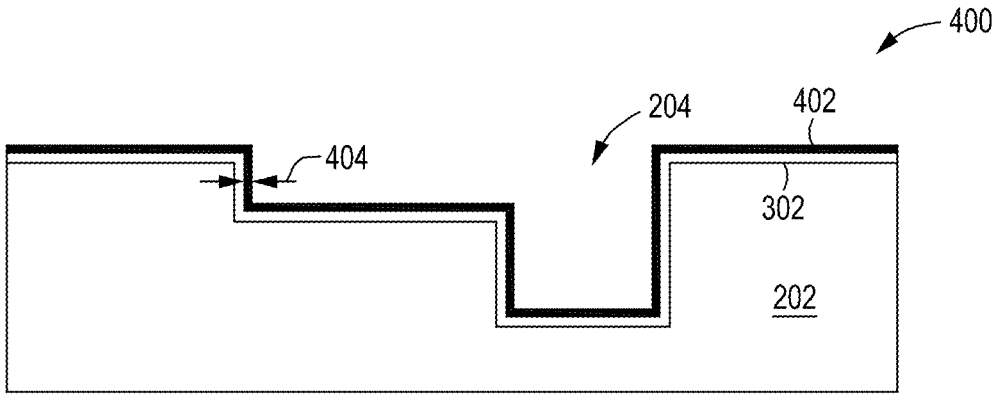
FIG. 4 depicts a cross-sectional view of a substrate with a grain control layer in accordance with some embodiments of the present principles.

In block 104, a grain control layer 402 is then conformally deposited onto the metal seed layer 302 as depicted in a view 400 of FIG. 4. In some embodiments, the grain control layer 402 may have a thickness 404 of approximately 100 nm or less. In some embodiments, the grain control layer 402 may have a thickness 404 of approximately 1 nm or less. In some embodiments, the thickness 404 of the grain control layer 402 may be the thickness of approximately one monolayer. The thickness 404 of the grain control layer 402 can be thinned as long as the thickness 404 ensures continuous and uninterrupted coverage of the metal seed layer 302. The thinness of the grain control layer 402 has the added benefit of having a negligible effect on the metal gapfill material volume, allowing for fine pitch formations and CD reductions, while still providing for grain parameter control during gapfill processes. The grain control layer 402 can be applied and removed as needed to control grain parameters of subsequently deposited metal gapfill material.

In some embodiments, the grain control layer 402 may be an inorganic dielectric material such as, but not limited to, silicon nitride (SiN), silicon dioxide (SiO₂), and/or silicon carbon nitride (SiCN), and the like. The added advantage of using inorganic materials is that the grain control layer 402 may remain in place as part of the structure 204. In some embodiments, a material may be selected for the grain control layer 402 that enhances the performance of the structure 204 beyond just grain control of subsequently deposited metal gapfill materials. Selection of the material for the grain control layer 402 may also be based on the adhesion properties of the material with the metal seed layer and metal gapfill materials. For example, SiN has high adhesion properties with copper seed layers and copper gapfill materials, maintaining the internal integrity of the structure 204. High adhesion keeps the gapfill material from breaking free from the surrounding structure and becoming an isolated post with poor performance.

In some embodiments, the grain control layer may be an organic dielectric material such as, but not limited to, fluoropolymer, polyimide, polybenzoxazole (PBO), and/or self-assembled monolayers (SAMs), and the like. The SAMs are formed by 2H-Perfluorooctyltrichlorosilane, 1H, 1H, 2H, 2H Perfluorodecanethiol, and/or 1H, 1H, 2H, 2H-Perfluorooctanephosphonic acid, and the like such as, but not limited to, octadecltrichlorosilane, octadecylthiol, and/or octadecylphosphophonic acid. The added advantage of using organic materials is that the grain control layer 402 may be easily removed from the structure 204 after gapfilling processes have been completed using plasma-based processes (e.g., O₂, H₂, N₂, etc.) if needed. SAMs allow the thickness of the grain control layer 402 to be reduced to the thickness of a single monolayer (sub-nanometer thicknesses).

Figures 11, 12:
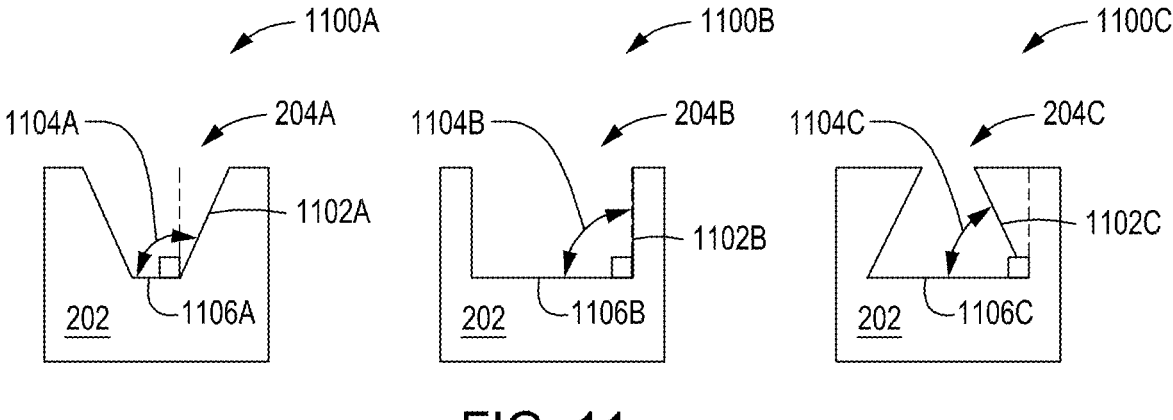
FIG. 11 depicts cross-sectional views of structure profiles for tuning grain control processes in accordance with some embodiments of the present principles.
FIG. 12 depicts a cross-sectional view of a substrate after deposition of a polymer layer in accordance with some embodiments of the present principles.

In block 106, a polymer layer 1202 is deposited in-situ on the substrate 202 in an etch chamber prior to a subsequent etching process (block 108) as depicted in a view 1200 of FIG. 12. The inventors found that during the etching process, the exposed corners 1204 of the structure 204 became vulnerable to the anisotropic etch process and the grain control layer 402 was damaged at the exposed corners 1204. The damaged corners of the grain control layer 402 led to decreased nanotwin copper formation at the corners and degraded hybrid bonding at the bonding surfaces. To enhance the protection of the exposed corners 1204 of the structure 204, the polymer layer 1202 is deposited as a non-conformal layer on the structure in the same chamber as the etch process but prior to performing the etch process. The non-conformal deposition causes polymer deposition to buildup on the horizontal surfaces 1208 and over the exposed corners 1204. Because the subsequent anisotropic etching process (block 108) has an etch rate much higher on horizontal surfaces than vertical surfaces, the exposed corners 1204 remain covered by the polymer longer during the etching process as denoted by an etch progress line 1206. Any polymer on the horizontal surfaces will be removed by the subsequent etch process along with the removal of horizontal portions of the grain control layer 402. In some embodiments, the structure 204 has an opening (e.g., via, etc.) small enough such that excess polymer layers 1202A are not deposited on horizontal surfaces within the structure 204. Even when excess polymer layers 1202A are present, the high horizontal etching rate of the subsequent etching process will remove the polymer from the interior horizontal surfaces.

Figure 5:
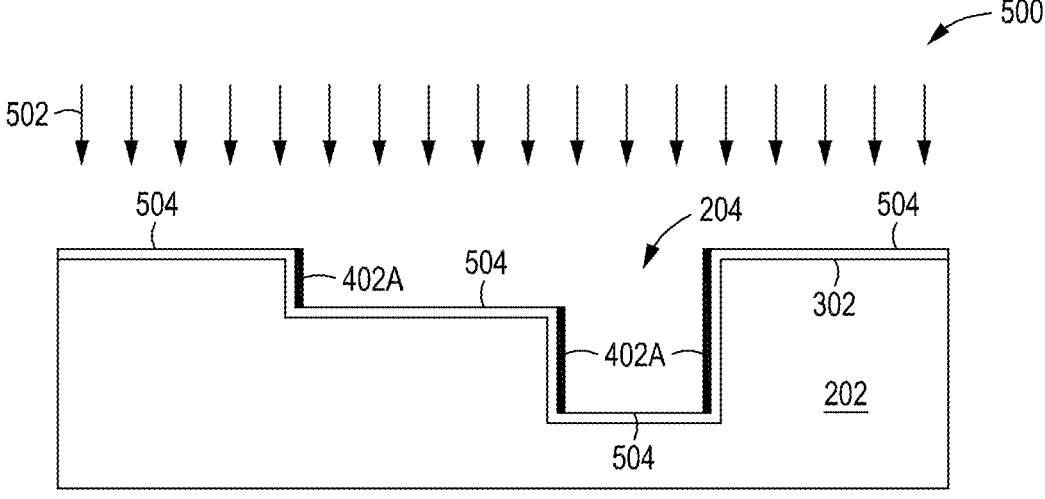
FIG. 5 depicts a cross-sectional view of a substrate undergoing an etch process in accordance with some embodiments of the present principles.

In block 108, in one example, the substrate 202 is subjected to an etch process 502 to remove portions of the grain control layer 402 on the horizontal surfaces 504 of the substrate 202 as depicted in a view 500 of FIG. 5. Other embodiments may control grain parameters of subsequently deposited gapfill materials by selectively removing any portion of the grain control layer 402 to control the grain parameters to achieve a desired effect on the subsequently deposited gapfill material. In some embodiments, the etch process 502 is a direct deep reactive ion etch (DRIE) which is a highly anisotropic dry etch process that etches horizontal surfaces at a much higher etch rate than vertical surfaces (e.g., 5× or more etch rate on bottom than sidewalls of structures). In some embodiments, the material of the grain control layer may be selected to ensure that the horizontal surfaces are etched at a substantially higher rate than the vertical surfaces of the structure. The remaining portions 402A of the grain control layer 402 inhibit metal gapfill material growth on the vertical surfaces, controlling the grain growth and grain orientation.

In some embodiments using DRIE processes, the method 100 can be further tuned by using a vertical surface slope to determine the etching profile of the structure 204. In a view 1100A of FIG. 11, the structure 204A has a sidewall 1102A (vertical surfaces) with an angle 1104A of greater than 90 degrees relative to the horizontal surface 1106A of the structure 204A. In the example, an anisotropic etch will substantially affect the vertical surfaces (thinning of grain control layer thickness) because of the horizontal component of the angle 1104A, decreasing the performance (over thinning or complete removal) of the grain control layer on the structure 204. In a view 1100B of FIG. 11, the structure 204B has a sidewall 1102B (vertical surfaces) with an angle 1104B of approximately 90 degrees relative to the horizontal surface 1106B of the structure 204B. In the example, an anisotropic etch will be extremely selective of the horizontal surface 1106B over the vertical surfaces because the angle 1104B of the sidewalls is perpendicular to the horizontal surface 1106B, increasing the performance of the grain control layer on the structure 204.

In a view 1100C of FIG. 11, the structure 204C has a sidewall 1102C (vertical surfaces) with an angle 1104C of less than 90 degrees relative to the horizontal surface 1106C of the structure 204C. In the example, an anisotropic etch will substantially affect the horizontal surface 1106C over the sidewall 1102C due to the undercut of the angle 1104C, increasing the performance (very little thinning due to etching) of the grain control layer on the structure 204. As depicted in FIG. 11, selection of the material for the grain control layer and also the profile of the structure 204 can both be used to tune the grain control layer performance. For example, a material more resistant to etching may be used on profiles with greater than 90-degree sidewalls while materials less resistant to etching (but with some other performance advantages for the structure, etc.) may be used with profiles with less than 90-degree sidewalls and the like.

Figure 6:
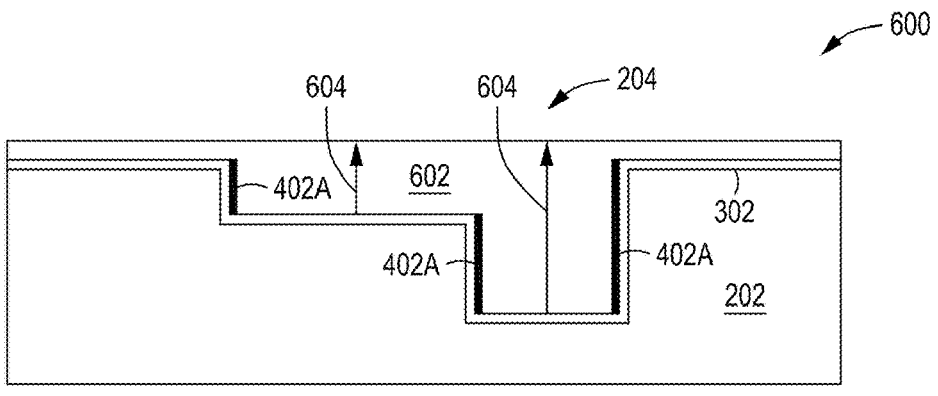
FIG. 6 depicts a cross-sectional view of a substrate with metal gapfill deposition in accordance with some embodiments of the present principles.

In block 110, a metal gapfill material 602 is deposited onto the substrate 202 as depicted in a view 600 of FIG. 6. In some embodiments, the metal gapfill material 602 is deposited using an ECP process. Due to the remaining portions 402A of the grain control layer 402, the metal gapfill material 602 only grows from the horizontal surfaces (the remaining portions 402A of the grain control layer 402 inhibit metal growth on the vertical surfaces). Thus, in the one example, the grain control layer 402 is used to direct grain growth 604 in a specific direction from specific surfaces of the structure 204 on the substrate 202. By controlling the direction of, for example, copper grain growth, the copper gapfill material will have a <111> grain orientation perpendicular to the horizontal surfaces which lowers the bonding temperature of the copper in a hybrid bonding process to less than 250 degrees Celsius.

Figure 7:
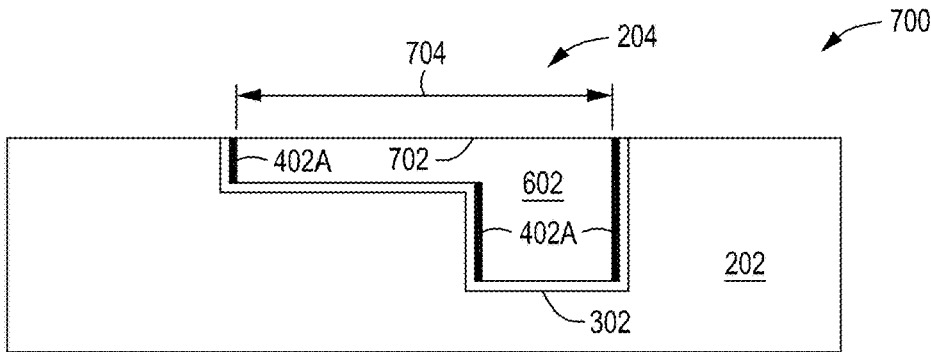
FIG. 7 depicts a cross-sectional view of a substrate after a planarization process in accordance with some embodiments of the present principles.
Figure 8:
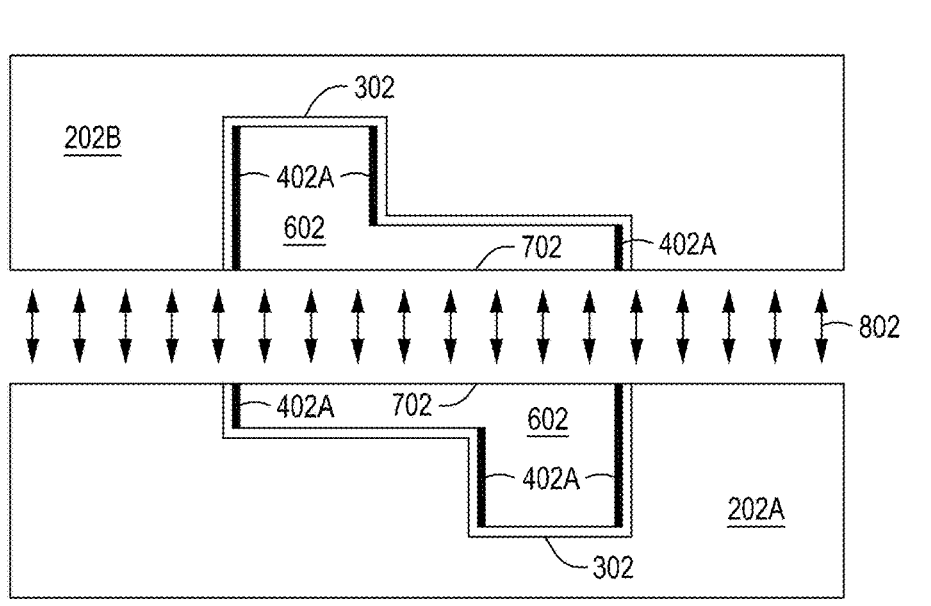
FIG. 8 depicts a cross-sectional view of substrates undergoing a hybrid bonding process in accordance with some embodiments of the present principles.

After gapfill processes have been completed, the substrate 202 may undergo a planarization process such as a chemical mechanical process (CMP) to remove bulk gapfill material as depicted in a view 700 of FIG. 7. The structure 204 has a top contact surface area 702 that has, for example, a <111> copper grain orientation across 704 the structure 204, maximizing the contact area with nanotwin copper for hybrid bonding with substantially lowered bonding temperatures. In a view 800 of FIG. 8, a first substrate 202A and a second substrate 202B have structures that have undergone the method 100 and CMP processes. The second substrate 202B has been flipped and is being brough into contact with the first substrate 202A to bond 802 the dielectrics and copper materials. As the metal gapfill materials of both structures have nanotwin copper grain structures on the contact surfaces of the structures, the bonding of the copper can occur at a lower temperature of 250 degrees Celsius or less compared to processes requiring 300 to 400 degrees Celsius for copper with randomized grain orientation.

Figure 9:
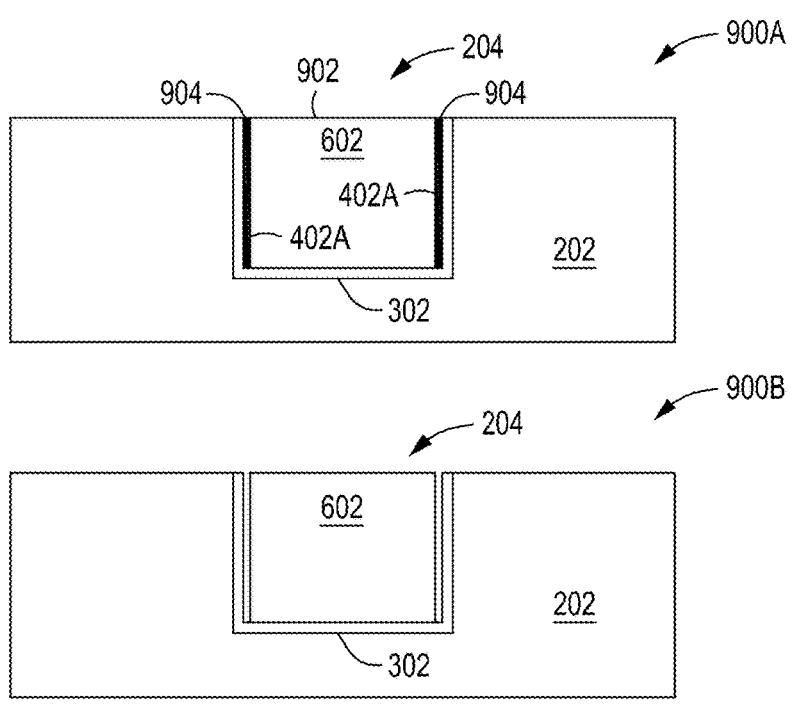
FIG. 9 depicts cross-sectional views of a substrate undergoing a plasma-based grain control layer removal process in accordance with some embodiments of the present principles.

FIG. 9 is an example of removal of the grain control layer 402 as opposed to the grain control layer 402 becoming a permanent part of the structure 204. In a view 900A of FIG. 9, the structure 204 is a via that has been formed using method 100 and an organic material for the grain control layer 402 with remaining portions 402A. The substrate 202 has undergone a CMP process that exposes the top 902 of the structure 204 and the uppermost surfaces 904 of the remaining portions 402A of the grain control layer 402. In a view 900b of FIG. 9, the substrate 202 undergoes a plasma-based process (e.g., $O_2$, $H_2$, $N_2$, etc.) that removes the remaining portions 402A of the grain control layer 402 from the structure 204 if needed.

Figure 10:
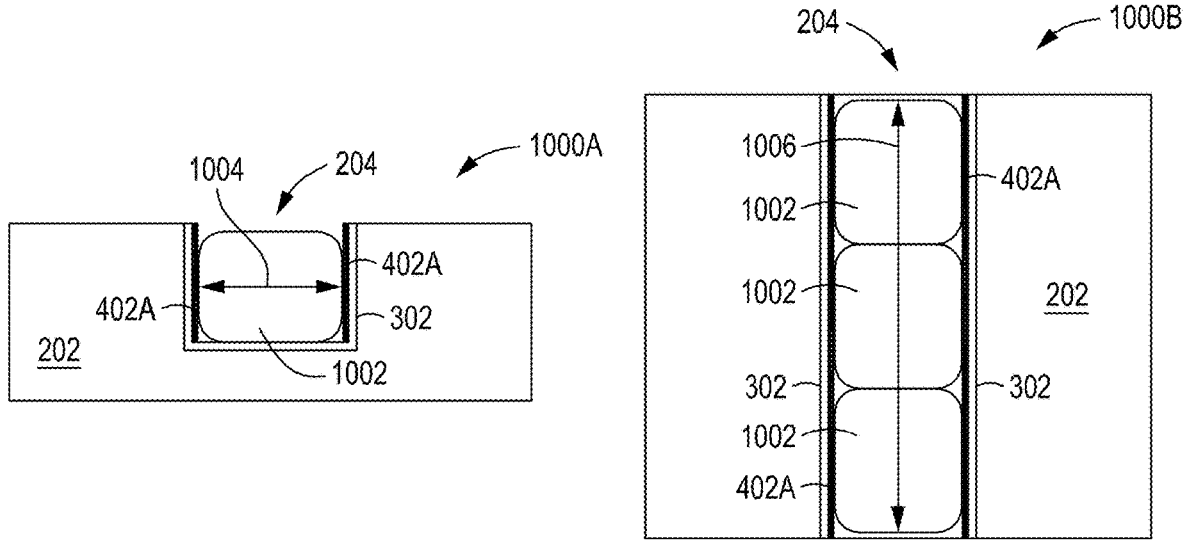
FIG. 10 depicts cross-sectional views of a single grain growth process controlled by a grain control layer in accordance with some embodiments of the present principles.

FIG. 10 is an example of additional grain parameter control that can be accomplished using the grain control layer 402. In the example as depicted in a view 1000A of FIG. 10, a metal grain 1002 is grown within the structure 204 such that a width 1004 of the metal grain 1002 reaches from sidewall to sidewall of the structure 204. The metal grain 1002 is repeatedly grown in the structure 204 such that the metal grain 1002 is grown in an end-to-end orientation 1006 within the structure 204 as depicted in a view 1000B of FIG. 10. The advantages of such a grain orientation are the ability to further scale down redistribution layers (RDLs) and the like to grain size parameters while reducing resistance of an RDL (end-to-end grain orientation has lower resistance than randomized grain orientations). The grain control layer 402 and the remaining portions 402A are used to prevent sidewall grain growth to allow formation of the desired grain orientation in the structure 204. The grain control layer 402 may be used to produce other grain size and/or orientations and, as such, the examples depicted are not meant to be limiting.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method for controlling gapfill material deposition processes, comprising:
   depositing a metal seed layer conformally onto a substrate with at least one structure formed into the substrate;
   depositing a grain control layer conformally onto the substrate and into the at least one structure, wherein the grain control layer is a non-conducting material;
   depositing a polymer layer on the substrate in an etch chamber such that at least one exposed corner of the at least one structure is covered during a subsequent etching process;
   etching the grain control layer using an etch process to remove portions of the grain control layer on horizontal surfaces within the at least one structure; and
   depositing a metal gapfill material onto the at least one structure such that at least one grain parameter of the metal gapfill material is controlled, at least in part, by a remaining portion of the grain control layer on vertical surfaces of the at least one structure.

2. The method of claim 1, wherein the at least one structure includes a trench, a via, or a damascene structure.

3. The method of claim 1, wherein the grain control layer is an inorganic dielectric material.

4. The method of claim 3, wherein the inorganic dielectric material is SiN, $SiO_2$, or SiCN.

5. The method of claim 1, wherein the grain control layer is an organic dielectric material.

6. The method of claim 5, wherein the organic dielectric material is a fluoropolymer material, a polyimide material, a polybenzoxazole material, or a self-assembled monolayer.

7. The method of claim 1, wherein depositing the metal gapfill material onto the at least one structure forms a copper gapfill material in the at least one structure with a <111> grain orientation normal to a horizontal surface of the at least one structure.

8. The method of claim 1, wherein depositing the metal gapfill material onto the at least one structure forms a copper gapfill material in the at least one structure with a copper grain orientated lengthwise along a length of the at least one structure and wherein the copper grain fills a width of the at least one structure.

9. The method of claim 1, wherein the at least one structure on the substrate has sidewalls of 90 degrees or less relative to horizontal surfaces within the at least one structure.

10. The method of claim 1, wherein the grain control layer is selected based on adhesion characteristics to the metal seed layer.

11. The method of claim 1, wherein the grain control layer has a thickness of approximately 1 nanometer or less.

12. The method of claim 1, wherein the at least one structure is a trench or via formed by a lithography process in a photo-imageable organic dielectric material of the substrate.

13. The method of claim 1, wherein the method is used in a copper-to-copper hybrid bonding process with a bonding temperature of 250 degrees or less.

14. The method of claim 1, wherein the grain control layer remains as part of the at least one structure during subsequent processing of the at least one structure.

15. The method of claim 1, wherein the metal gapfill material is deposited using electrochemical plating.

16. The method of claim 1, wherein the etch process is a direct deep reactive ion etch (DRIE) process.

17. A method for depositing copper, comprising:

depositing a grain control layer conformally onto a copper seed layer in at least one structure on a substrate, wherein the grain control layer is a non-conducting material;

depositing a polymer layer on the substrate in an etch chamber such that at least one exposed corner of the at least one structure is covered during a subsequent etching process;

etching the grain control layer using a direct deep reactive ion etch (DRIE) process to remove portions of the grain control layer on horizontal surfaces within the at least one structure; and depositing a copper gapfill material onto the at least one structure such that at least one grain parameter of the copper gapfill material is controlled, at least in part, by a remaining portion of the grain control layer on vertical surfaces of the at least one structure, wherein deposited copper gapfill material in the at least one structure has a <111> grain orientation normal to a horizontal surface of the at least one structure.

18. The method of claim 17, wherein the grain control layer is an organic dielectric material.

19. The method of claim 17, wherein the grain control layer has a thickness of approximately 1 nanometer or less.

20. A non-transitory, computer readable medium having instructions stored thereon that, when executed, cause a method for depositing copper to be performed, the method comprising:

depositing a grain control layer conformally onto a copper seed layer in at least one structure on a substrate, wherein the grain control layer is a non-conducting material;

depositing a polymer layer on the substrate in an etch chamber such that at least one exposed corner of the at least one structure is covered during a subsequent etching process;

etching the grain control layer using a direct deep reactive ion etch (DRIE) process to remove portions of the grain control layer on horizontal surfaces within the at least one structure; and depositing a copper material onto the at least one structure such that at least one grain parameter of the copper material is controlled, at least in part, by a remaining portion of the grain control layer on vertical surfaces of the at least one structure, wherein deposited copper material in the at least one structure has a <111> grain orientation normal to a horizontal surface of the at least one structure.

* * * * *